US010327083B2

(12) United States Patent
Rusconi Clerici Beltrami et al.

(10) Patent No.: US 10,327,083 B2
(45) Date of Patent: Jun. 18, 2019

(54) MEMS SOUND TRANSDUCER WITH CLOSED CONTROL SYSTEM

(71) Applicant: USOUND GMBH, Graz (AT)

(72) Inventors: Andrea Rusconi Clerici Beltrami, Vienna (AT); Ferruccio Bottoni, Graz (AT)

(73) Assignee: USound GmbH, Graz (AT)

( * ) Notice: Subject to any disclaimer, the term of this patent is extended or adjusted under 35 U.S.C. 154(b) by 0 days.

(21) Appl. No.: 15/752,659

(22) PCT Filed: Aug. 1, 2016

(86) PCT No.: PCT/EP2016/068295
§ 371 (c)(1),
(2) Date: Feb. 14, 2018

(87) PCT Pub. No.: WO2017/032555
PCT Pub. Date: Mar. 2, 2017

(65) Prior Publication Data
US 2018/0234783 A1 Aug. 16, 2018

(30) Foreign Application Priority Data
Aug. 27, 2015 (DE) .................. 10 2015 114 245

(51) Int. Cl.
*B81B 7/00* (2006.01)
*H04R 3/00* (2006.01)
(Continued)

(52) U.S. Cl.
CPC ........... *H04R 29/001* (2013.01); *B81B 7/008* (2013.01); *H04R 3/002* (2013.01); *H04R 3/007* (2013.01);
(Continued)

(58) Field of Classification Search
None
See application file for complete search history.

(56) References Cited

U.S. PATENT DOCUMENTS 2,860,183 A 11/1958 Conrad
2011/0075867 A1 3/2011 Chung et al.
(Continued)

FOREIGN PATENT DOCUMENTS

DE 10256033 6/2004
DE 102011054009 3/2013
(Continued)

OTHER PUBLICATIONS

International Search Report (PCT/EP2016/068295), dated Oct. 31, 2016.
(Continued)

*Primary Examiner* — Curtis A Kuntz
*Assistant Examiner* — Kenny H Truong
(74) *Attorney, Agent, or Firm* — Dority & Manning, P.A.

(57) ABSTRACT

The invention relates to a MEMS sound transducer, in particular a MEMS loudspeaker and/or a MEMS microphone, for generating and/or detecting sound waves in the audible wavelength spectrum, with a support element (9), a membrane (2) deflectable with respect to the support element (9) along a z-axis, at least one piezoelectric actuator (7) supported on the support element (9) for deflecting the membrane (2) and one electronic control unit (11) for driving the actuator (7). In accordance with the invention, the MEMS sound transducer features at least one position sensor (19), by means of which the control unit (11) can provide a sensor signal (37) that is dependent on the membrane deflection. Furthermore, the control unit (11) is designed such that, for the functional self-test, for distortion reduction, for damage protection and/or for the compensa-
(Continued)

tion of behavioral changes, the sensor signal can be analyzed and/or can be reconciled with a reference signal (8) stored in the control unit (11), and that the actuator (7) can be driven in a controlled manner by taking into account the analysis result (35) and/or the comparison result (34).

11 Claims, 4 Drawing Sheets

(51) Int. Cl.
*H04R 3/04* (2006.01)
*H04R 7/16* (2006.01)
*H04R 17/00* (2006.01)
*H04R 29/00* (2006.01)

(52) U.S. Cl.
CPC .............. *H04R 3/04* (2013.01); *H04R 7/16* (2013.01); *H04R 17/00* (2013.01); *H04R 29/004* (2013.01); *B81B 2201/0257* (2013.01); *B81B 2207/03* (2013.01); *H04R 2201/003* (2013.01)

(56) References Cited

U.S. PATENT DOCUMENTS

| | | |
|---|---|---|
| 2011/0182150 A1 | 7/2011 | Cohen et al. |
| 2012/0300949 A1* | 11/2012 | Rauhala ................. H04R 3/007 381/55 |
| 2013/0108074 A1* | 5/2013 | Reining ................. H04R 3/005 381/92 |
| 2014/0060146 A1 | 3/2014 | Zoellin et al. |
| 2014/0177881 A1 | 6/2014 | Fanget et al. |
| 2014/0341394 A1* | 11/2014 | Croft, III ............. H04R 1/2811 381/102 |
| 2015/0350800 A1* | 12/2015 | Haber .................... H04R 1/005 381/59 |
| 2017/0094418 A1 | 3/2017 | Clerica et al. |

FOREIGN PATENT DOCUMENTS

| | | |
|---|---|---|
| DE | 102012215239 | 3/2014 |
| DE | 10 2014 106 753 | 11/2015 |
| EP | 1051058 | 11/2000 |
| WO | WO 86/01362 | 2/1986 |

OTHER PUBLICATIONS

International Preliminary Report on Patentability (PCT/EP2016/068295), dated Feb. 27, 2018.
German Search Report (10 2015 114 245.7), dated Apr. 25, 2016.

* cited by examiner

MEMS SOUND TRANSDUCER WITH CLOSED CONTROL SYSTEM

CROSS-REFERENCE TO RELATED APPLICATIONS

This application claims priority to International Application Serial No. PCT/EP2016/068295, filed Aug. 1, 2016, which claims priority to German Application No. 10 2015 114 245.7, filed Aug. 27, 2015. International Application Serial No. PCT/EP2016/068295 is hereby incorporated herein in its entirety for all purposes by this reference.

FIELD OF THE INVENTION

The present invention relates to a MEMS sound transducer, in particular a MEMS loudspeaker and/or a MEMS microphone, for generating and/or detecting sound waves in the audible wavelength spectrum with a support element, in particular a membrane support frame, a membrane that is deflectable with respect to the support element along a z-axis, at least one piezoelectric actuator supported on the support element for deflecting the membrane and one electronic control unit for driving the actuator.

BACKGROUND

The term "MEMS" stands for microelectromechanical systems. Such systems are particularly installed in electronic devices that offer little installation space. The performance of known MEMS loudspeakers is largely dependent on ideal environmental conditions. Even small impacts or other environmental influences, such as temperature or air pressure, can have adverse effects on the performance of the system. Furthermore, aging effects can have negative influences on the performance of such MEMS acoustic transducers. However, today's requirements for such MEMS loudspeakers demand a sound quality that is at least consistent over the long term, even with changing external influences.

OBJECTS AND SUMMARY OF THE INVENTION

The task of the present invention is to provide a MEMS sound transducer with which the disadvantages known from the prior art can be eliminated, in particular to provide a MEMS loudspeaker, which, compared to that known from the prior art, features a longer service life, an improved performance and/or an improved sound quality.

The task is achieved by a MEMS loudspeaker with the characteristics of the independent claim 1.

A MEMS sound transducer, in particular a MEMS loudspeaker and/or a MEMS microphone, for generating and/or detecting sound waves in the audible wavelength spectrum is proposed. The MEMS sound transducer features a support element and a membrane that is deflectable with respect to the support element along a z-axis. At this, the support element may be a support frame. The membrane preferably spans a recess of the support frame, such that the membrane is deflectable with respect to the support frame for generating and/or detecting sound waves in the z-direction. Furthermore, the MEMS sound transducer comprises at least one piezoelectric actuator supported on the support element for deflecting the membrane. At this, the piezoelectric actuator is preferably designed as a cantilever. Accordingly, one of its two ends is firmly attached to the support element, whereas, on the other hand, the free end is deflectable in the z-direction. With the other end that is freely movable with respect to the support element, the actuator is preferably connected indirectly to the membrane via a support structure, such that, when the actuator is deflected, the membrane is deflected in the z-axis at the same time. The piezoelectric actuator preferably comprises at least one piezoelectric layer.

In addition, the MEMS transducer comprises an electronic control unit for driving the actuator. Furthermore, the MEMS sound transducer features at least one position sensor. With this, the position or deflection of the membrane along the Z-axis can be detected indirectly and/or directly. The position sensor is preferably a piezoelectric, a piezoresistive and/or a capacitive sensor. By means of the position sensor, the control unit can provide a sensor signal that is dependent on the membrane deflection.

The control unit is electrically connected to the at least one actuator and position sensor. Furthermore, the control unit is designed to perform a functional self-test or a functional self-test process. In doing so, there is an examination of whether the MEMS sound transducer, in particular its individual components, such as the actuator, position sensor and/or membrane, is functioning properly. Moreover, the control unit is designed to perform a distortion reduction or a distortion reduction process. At this, through a suitable drive of the actuator, the control unit prevents or at least reduces distortions of the MEMS sound transducer in the sound output. In addition, the control unit is designed to perform a damage protection or a damage protection process, with which the moving components of the MEMS sound transducer (that is, in particular, the actuator, the position sensor and/or the membrane) are protected from overloading and damages resulting from this. Furthermore, the control unit is designed to perform a compensation process with which, in particular, compensation is provided for behavioral changes of the MEMS sound transducer caused by aging effects and/or external influences. In order to be able to perform the functional self-test process, the distortion reduction process, the damage protection process and/or the compensation process, the control unit is designed such that the sensor signal can be analyzed to obtain an analysis result and/or can be reconciled to obtain a comparison result with a reference signal stored in the control unit. Accordingly, the control unit analyzes the sensor signal and/or reconciles it with the reference signal. For example, properties of the MEMS sound transducer, such as its natural frequency, can be determined through the analysis of the actual sensor signal. Furthermore, for example, a non-linear oscillation of the sensor signal can be identified.

By reconciling the sensor signal with the reference signal, behavioral changes of the MEMS sound transducer can be detected when a deviation is detected. Such behavioral changes can be caused, for example, by external influences, in particular temperature and/or pressure changes. Likewise, however, aging effects, in particular the piezoelectric layer of the actuator, can also cause a change in behavior. Thus, due to external influences or aging effects, the piezoelectric coefficient can degenerate, by which the piezoelectric performance is reduced. As a result, at a reference voltage in the course of time, the piezoelectric actuator can bring about an ever-lower force and consequently an ever smaller lift of the membrane.

Furthermore, through such a reconciliation, non-linear oscillations of the MEMS sound transducers, which bring about a distortion of the sound that is emitted, can also be identified. However, overloads that can lead to damage to the moving components of the MEMS transducer can also be identified by such an analysis and/or such a reconciliation.

In order to be able to avoid damage to the MEMS sound transducer and to be able to ensure the sound quality at a consistently high level, independently of external influences and aging effects, the control unit is also designed such that the actuator can be driven in a controlled manner, taking into account the analysis result and/or the comparison result, or is driven in a controlled manner by the control unit. Accordingly, the actuator henceforth can be operated with a higher electrical voltage, for example, upon detecting an aging-related power reduction or a power reduction caused by external influences. Accordingly, the piezoelectric actuator is at this operated with a higher voltage compensating for the power reduction. However, the piezoelectric actuator can also be operated with a reduced voltage upon a detected overload and/or distortion. In summary, it must be accordingly stated that the MEMS sound transducer with a control unit designed according to the preceding description can be operated in a more durable manner and/or over a longer period of time with a consistently high sound quality.

It is advantageous if, by means of the control unit, at least one signal value can be analyzed and/or reconciled with a reference value. In addition, or alternatively, it is also advantageous if the chronological signal progression of the sensor signal can be analyzed and/or reconciled with a reference signal progression. This can preferably take place within a time window and/or a defined frequency range. Thus, it is particularly advantageous to analyze at least one individual signal value and/or to reconcile it with a reference value, in order to be able to perform a functional test, to be able to adjust a behavioral change and/or to identify an overload. Furthermore, a nonlinear oscillation can be determined in particular by analyzing and/or reconciling a signal curve for reducing distortion.

For the functional self-test and/or for adjusting a behavioral change, it is advantageous if the control unit is designed such that, through the analysis of the actual sensor signal transmitted from the position sensor to the control unit, an actual standard behavior of the MEMS sound transducer can be determined. At that point, in particular during the initial startup of the MEMS sound transducer, such actual standard behavior that is determined can be stored as a reference standard behavior in a memory of the control unit. Such actual standard behavior that is detected in a first step then forms the new reference signal or the new target standard behavior, by means of which a new behavioral change of the MEMS sound transducer can be detected through a new reconciliation.

For the functional self-test, it is also advantageous if a target sensor signal that is dependent on the reference actuator signal is stored in the control unit. Such target sensor signal accordingly reflects the target standard behavior of the MEMS sound transducer.

For the functional self-test, it is also advantageous if the control unit is designed such that the actuator can be driven with the reference actuator signal, which brings about or generates a target deflection of the membrane. After this drive with the reference actuator signal, it is advantageous if the actual sensor signal that is dependent on the actual deflection can be reconciled with the target sensor signal. Furthermore, it is advantageous if the control unit is able to determine a deviation of the actual sensor signal from the target sensor signal upon such reconciliation. In addition, or alternatively, it is advantageous if the control unit issues an error message in the event of a detected deviation and/or reports it to a higher-order control unit. As a result, the MEMS sound transducer preferably can independently check whether it is operating properly. If this is not the case, it is advantageous if the control unit is designed such that, from then on, upon a drive of the actuator, it compensates for such behavioral change through an adjustment to the electronic drive.

Furthermore, it is advantageous if the control unit is designed such that it is able to perform the functional self-test automatically upon an event detected by a sensor. Such an event is, in particular, an identified system start, an external impact detected by a sensor or a behavioral change of the MEMS transducer detected by a sensor.

Upon the functional self-test, it is advantageous if the control unit is designed such that it can differentiate between at least two types of errors, in particular actuator damage, membrane damage and/or a blockage of the sound outlet opening. In this manner, a targeted countermeasure can be initiated in order to at least partially compensate for the identified error.

In the following, advantageous embodiments of the control unit for reducing distortion reduction are addressed. Accordingly, it is advantageous if the control unit for reducing distortion is designed such that a nonlinear oscillation of the MEMS sound transducer can be determined through the analysis of the actual sensor signal. For this purpose, the chronological signal progression of the sensor signal is preferably analyzed. Distortions can be detected through such an identified non-linear oscillation.

For reducing distortion, it is advantageous if the control unit is designed such that the actuator can be driven with a compensation actuator signal that at least partially reduces the non-linear oscillation that is determined. As a result, the sound quality of the MEMS sound transducer can be improved.

To implement damage protection, the control unit is preferably designed according to the following description. Accordingly, it is advantageous if the control unit is designed such that a maximum deflection of the membrane can be determined through the analysis of the actual sensor signal, in particular the height of at least one signal value. As a result, an overloading of the moving components of the MEMS sound transducer that is already occurring or imminent can be reliably identified.

For damage protection, it is also advantageous if a threshold value with a maximum permissible threshold value level is stored in the control unit. At this, the threshold value or its threshold value height defines the maximum permissible deflection along the z-axis, up to which the MEMS sound transducer can be operated at least without damage.

In addition, it is advantageous if the control unit for the damage protection of the MEMS sound transducer is designed such that, for detecting an overload, the actual sensor signal that is dependent on a first deflection, in particular at least one individual signal value, can be reconciled with the maximum permissible threshold value. Furthermore, it is advantageous if the control unit is designed to, when the threshold value is exceeded, be able to drive the actuator with an identified, in particular reduced, actuator signal, which generates a second deflection reduced to the first deflection. In this manner, the moving components of the MEMS sound transducer being deflected so strongly that they are damaged can be advantageously avoided.

The following specifications of the control unit are particularly advantageous for damage protection and/or for the compensation of behavioral changes of the MEMS sound transducer. Accordingly, it is advantageous if, for this purpose, the control unit is designed such that an actual natural frequency of the MEMS sound transducer can be determined through the analysis of the actual sensor signal. At this, the actual natural frequency represents a property that represents the current behavior of the MEMS sound transducer. Furthermore, knowledge regarding the actual natural frequency is necessary in order to, in the event of a drive in the range of the natural frequency that is too long in terms of time, be able to avoid damage to the MEMS sound transducer.

It is advantageous if an analysis signal, in particular a noise signal, is stored in the control unit for determining the actual natural frequency. The analysis signal preferably extends within a frequency range that is below the resonance frequency of the MEMS sound transducer.

In this regard, it is further advantageous if the control unit for determining the actual natural frequency is designed such that the actuator can be driven with the analysis signal and/or a maximum identifying the actual natural frequency can be determined within the frequency range. As a result, the actual natural frequency of the MEMS sound transducer can be determined quickly and with simple means.

For damage protection and/or for the compensation of behavioral changes, it is advantageous if a reference natural frequency is stored in the control unit.

Furthermore, it is advantageous in this regard if the control unit for damage protection and/or for the compensation of behavioral changes is designed such that the actual natural frequency of the MEMS sound transducer that is determined can be reconciled with the stored reference natural frequency.

In addition or alternatively, it is also advantageous if, upon a deviation of the actual natural frequency from the reference natural frequency, the actual natural frequency that is determined can be stored as a new reference natural frequency.

In this regard, it is advantageous if the control unit for damage protection and/or for the compensation of behavioral changes is designed such that the drive of the actuator takes place while taking into account the new reference natural frequency. Accordingly, the newly determined and stored reference natural frequency can then be taken into account in order to, in order to avoid an overload, drive the MEMS sound transducer in the range of the new natural frequency in a manner that is reduced in terms of time. Furthermore, the new stored reference natural frequency is used to identify additional behavioral changes in the course of time.

Preferably, the control unit is designed such that it carries out the aforementioned process features individually or in any combination within the framework of the functional self-test process, the distortion reduction process, the damage protection process and/or the compensation process.

A work process for a MEMS sound transducer according to the preceding description, whereas the aforementioned features, in particular with respect to the mode of operation of the control unit, may be present individually or in any combination, is also proposed. Furthermore, in particular, a work process for the functional self-test, for distortion reduction, for damage protection and/or for the compensation of behavioral changes is proposed, whereas at least one of such processes is designed according to the preceding description. Here as well, the specified process features may be present individually or in any combination.

Accordingly, in particular a MEMS sound transducer process for the functional self-test, for distortion reduction, for damage protection and/or for the compensation of behavioral changes, with which a sensor signal that is dependent on a membrane deflection is detected via at least one position sensor, the sensor signal is transmitted to a control unit, the control unit analyzes the sensor signal and/or reconciles it with a reference signal stored in the control unit and drives the actuator in a controlled manner by taking into account the analysis result and/or the comparison result, is proposed. The process is performed with a MEMS sound transducer according to the preceding description, whereas the MEMS sound transducer, in particular its control unit, performs a functional self-test process, a distortion reduction process, a damage protection process and/or a compensation process.

BRIEF DESCRIPTION OF THE DRAWINGS

Further advantages of the invention are described in the following embodiments. The following is shown.

DETAILED DESCRIPTION OF EXEMPLARY EMBODIMENTS

In the following description of the figures, in order to define the relationships between the various elements, with reference to the locations of objects shown in the figures, relative terms, such as above, below, up, down, over, under, left, right, vertical and horizontal are used. It is self-evident that such a term may change in the event of a deviation from the location of a device and/or element shown in the figures. Accordingly, for example, in the case of an orientation of a device and/or an element shown inverted with reference to the figures, a characteristic that has been specified as "above" in the following description of the figures would now be arranged "below." Thus, the relative terms are used solely for a more simple description of the relative relationships between the individual devices and/or elements described below.

Figure 1:
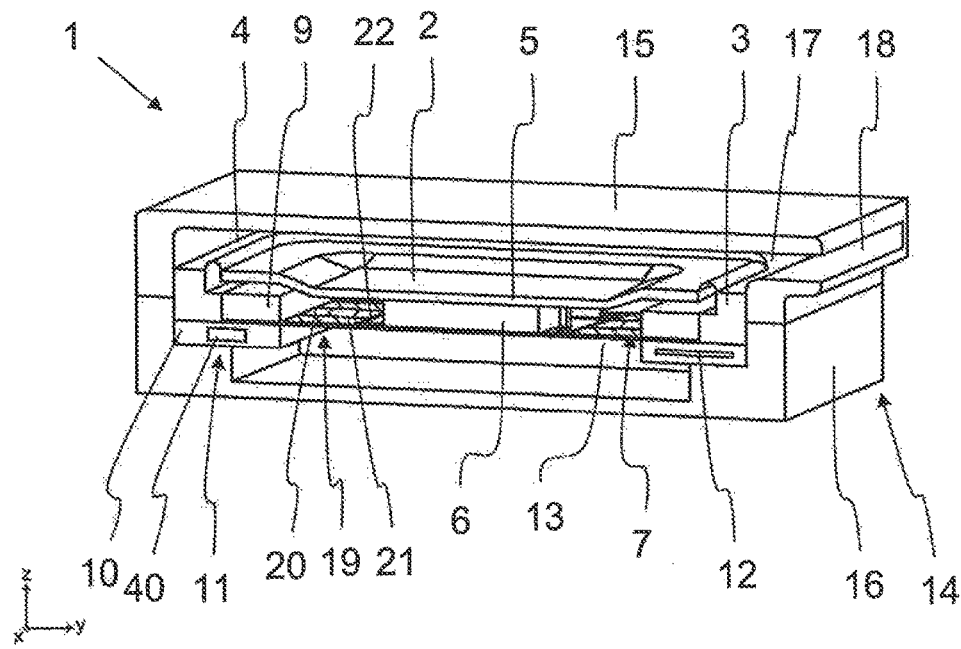
FIG. 1 a perspective sectional view of a MEMS loudspeaker according to one embodiment of the present invention, FIG. 2 a schematic top view of an embodiment of a piezoelectric actuator with an integrated position sensor, FIG. 3 a schematic top view of a second embodiment of a piezoelectric actuator with an integrated position sensor, FIG. 4 a schematic side view of the second embodiment of a piezoelectric actuator with an integrated position sensor, FIG. 5 a schematic top view of a third embodiment of a piezoelectric actuator with a piezoresistive position sensor, FIG. 6 a schematic top view of a fourth embodiment of a piezoelectric actuator with a capacitive position sensor and FIG. 7 a schematic representation of the flow of information between the control unit, the actuator and the position sensor, illustrating the mode of operation of the MEMS transducer.

FIG. 1 shows a first embodiment of a MEMS sound transducer, which is preferably designed as a MEMS loudspeaker 1. Alternatively, this could also be designed in particular as a MEMS microphone.

The MEMS loudspeaker 1 is designed to generate sound waves in the audible wavelength spectrum. For this purpose, the MEMS loudspeaker 1 has a membrane 2 and a membrane carrier 3. The membrane 2 is connected with the membrane carrier 3 in its edge area 4, and is able to oscillate along a z-axis with respect to the membrane carrier 3. At this, the z-axis essentially extends perpendicular to the membrane 2. A reinforcing element 5 is arranged at the bottom of the membrane 2.

The MEMS loudspeaker 1 features, in addition to the membrane 2, a lifting structure 6, which is coupled to the membrane 2, and at least one piezoelectric actuator 7. The actuator 7 is connected via a lifting structure 6 to the membrane 2 movable in the z-direction. The membrane carrier 3 is arranged on a carrier substrate 9 of the piezoelectric actuator 7. The piezoelectric actuator 7 is arranged below the membrane 2 and/or essentially parallel to it. The piezoelectric actuator 7 is designed to bring about a unidirectional or bidirectional lifting movement of the lifting structure 6, in order to deflect the membrane 2. It works together with the membrane 2 in order to convert electrical signals into acoustically perceptible sound waves. The piezoelectric actuator 7 or the piezoelectric actuator structure, as the case may be, is arranged on a side of the carrier substrate 9 turned away from the membrane 2.

Furthermore, the MEMS loudspeaker 1 comprises a printed circuit board 10. An electronic control unit 11, in particular an ASIC, is completely embedded in the printed circuit board 10. Thus, the control unit 11 is completely encapsulated. In addition to the control unit 11, additional passive components 12, such as electrical resistors and/or I/O contacts, can be embedded in the printed circuit board 10 and/or arranged on it. The MEMS loudspeaker 1 and, in particular, the piezoelectric actuator 7 are connected to the control unit 11 with electrical contacts not further illustrated in the figures. Thus, the MEMS loudspeaker 1 can be driven or operated via the control unit 11, such that, through the piezoelectric actuator 7, the membrane 2 is set into vibration in order to generate sound energy with respect to the membrane support 3. The piezoelectric actuator 7 is at this designed as a cantilever 13. Accordingly, it has a securely clamped and a freely vibrating end.

The MEMS loudspeaker 1 is arranged in a housing 14 according to FIG. 1. The housing 14 comprises an upper housing part 15 and a lower housing part 16. The upper housing part 15 forms a sound-conducting channel 17 with an acoustic inlet/outlet opening 18. This is arranged laterally on an outer surface of the MEMS loudspeaker 1. The housing 14 in particular provides additional protection for the membrane 2, as it covers it with respect to the environment.

The MEMS loudspeaker 1 features at least one position sensor 19. The position sensor 19 is designed to provide the electronic control unit 11 with a sensor signal that is dependent on the membrane deflection. The control unit 11 is designed to drive the actuator 7 in a controlled manner based on the sensor signal. For this purpose, the position sensor 19 may be a piezoelectric, a piezoresistive and/or a capacitive sensor. The position sensor 19 is at least partially integrated in the actuator 7, in particular in the cantilever 13.

Figure 2:
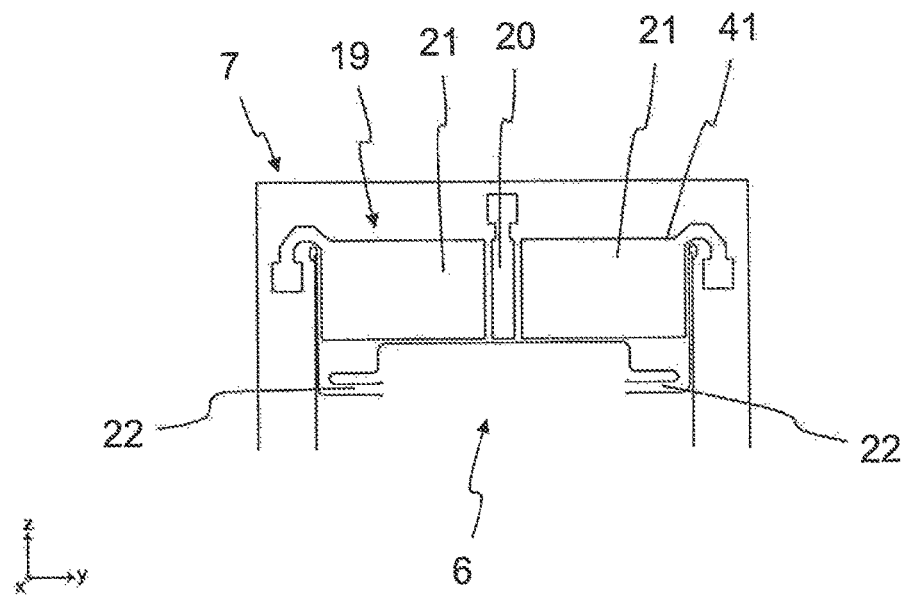

In the embodiment illustrated in FIG. 1, the position sensor 19 may be designed in accordance with the subsequent embodiments shown in the figures. Accordingly, the position sensor 19 and the piezoelectric actuator 7 according to the embodiment illustrated in FIG. 2 is formed by a common piezoelectric layer 41 (see FIG. 2). The piezoelectric layer 41 is formed from lead zirconate titanate (PZT). At least one area is a sensor area 20, through which two actuator areas 21 are arranged at a distance from each other. The sensor and actuator areas 20, 21 are electrically isolated from each other. Since the requirements for sensors and actuators may differ, a combination of different piezoelectric materials with different properties is also conceivable. At this, the sensor area 20 can be made from PZT and the actuator area 21 can be made from aluminum nitride (AlN).

According to FIG. 2, the sensor area 20 is arranged between the two actuator areas 21 and extends symmetrically in the longitudinal direction of the cantilever. The actuator areas 21 are completely separated from each other by the sensor area 20. The sensor area 20 and the actuator area 21 feature the same length in the longitudinal direction of the cantilever. In terms of area, the two actuator areas 21 are larger than the sensor area 20.

When the membrane 1 is deflected via the actuator 7, its position or deflection in the z-direction, as the case may be, is detected by means of the position sensor 19. At this, the voltage generated via the piezoelectric effect, which is approximately proportional to the deflection of the lifting structure 6, is tapped via the actuator electrodes and evaluated accordingly. Based on this detected input signal, the control unit 11 determines the actual position or actual deflection, as the case may be, of the membrane 2. In doing so, the elastic vibration characteristics of a connecting element 22 are taken into account. The connecting element 22 connects a free end of the position sensor 19 to the lifting structure 6. As a function of such detected actual position of the membrane 2, the control unit 11 determines a desired target position of the membrane and/or an electronic output signal that depends on it. The output signal is transmitted to the actuator 7, which deflects the membrane 2 accordingly. During and/or at the end of the deflection movement, via the position sensor 19, the actual position of the membrane 2 is detected once again and, if appropriate, is adjusted once again to the environmental conditions according to the preceding description.

As already mentioned above, FIG. 2 shows a schematic top view of a first embodiment of a piezoelectric actuator 7 with an integrated position sensor 19. At this, the piezoelectric actuator 7 features two actuator areas 21, which are separated from each other by the sensor area 20. Both areas 20, 21 are formed from PZT. However, other piezoelectric materials are conceivable. It would also be conceivable that a large part is used for the actuators and only a small area is used for the sensor. At this, the sensor area 20 is electrically isolated from the actuator areas 21. In order to prevent the unwanted tilting of the lifting structure 6 due to an asymmetrical drive, the actuator and sensor areas 21, 20 should be arranged in pairs opposite each other.

Figure 3:
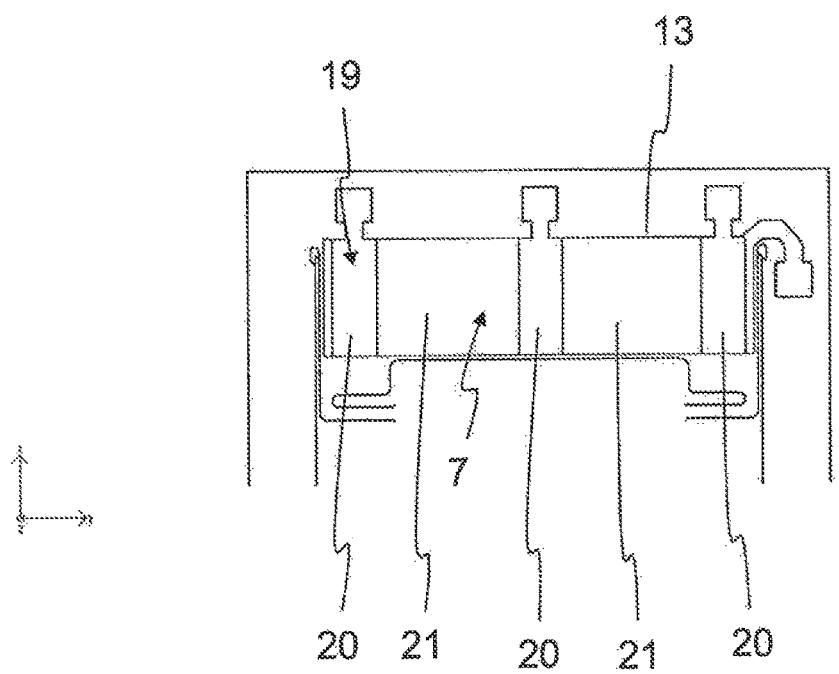
Figure 4:
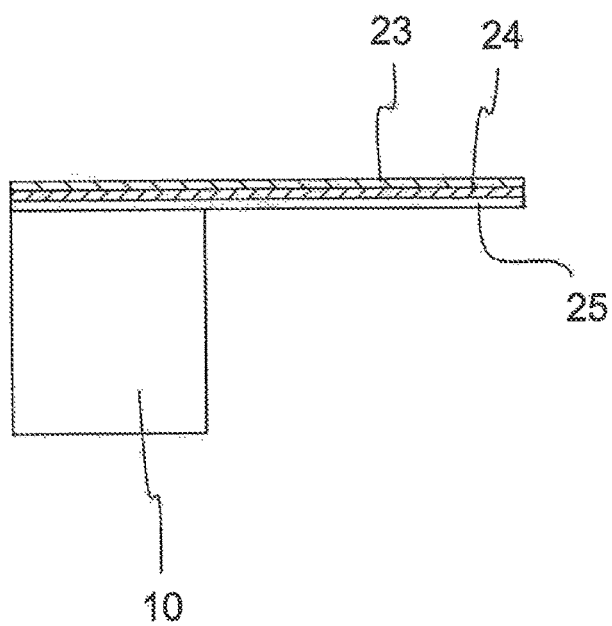

Each of FIGS. 3 and 4 shows a schematic view of a second embodiment of the piezoelectric actuator 7 with a position sensor 19. At this, the piezoelectric position sensor 19 is formed according to FIG. 4 by a first piezoelectric layer 23, in particular made of AlN. The piezoelectric actuator 7 is formed by a second piezoelectric layer 24, in particular made of PZT. The two layers are electrically isolated from each other and arranged one above the other with respect to the z-axis.

The first piezoelectric layer 23 is subdivided into a multiple number of sensor areas 20 according to FIG. 3. The sensor areas 20 are separated and/or electrically isolated from each other. In the embodiment shown in FIG. 3, three sensor areas 20, which are arranged in a manner spaced apart in the transverse direction of the cantilever, are formed. In particular, this is done equidistantly. The second piezoelectric layer 24 features an actuator area 21 extending over the cantilever 13. Such actuator area 21 extends over the entire surface of the cantilever 13, at least in a top view. The two actuator areas 21 feature the same length in the longitudinal direction of the cantilever. However, it is also conceivable that the sensor area 20 does not extend over the entire longitudinal direction of the cantilever, but only over a part of it. In such a case, the difference to the cantilever length would be formed by another actuator area, which is not shown.

As shown in FIG. 4, both piezoelectric layers 23, 24 form a stack, which is supported by a support layer 25. The support layer 25 is connected to the printed circuit board 10. In the embodiment shown, the first piezoelectric layer 23, which forms the position sensor 19, is arranged above the second piezoelectric layer 24, in particular the actuator 7. However, the first piezoelectric layer 23 could also be arranged below the piezoelectric actuator 7.

Figure 5:
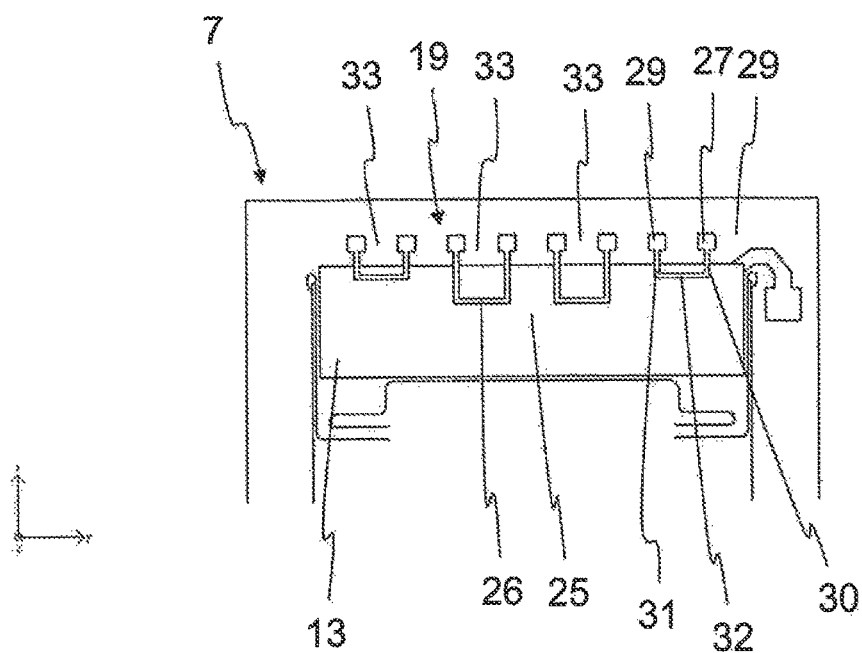

FIG. 5 shows a schematic top view of a third embodiment of a piezoelectric actuator 7 with an integrated position sensor 19. At this, the position sensor 19 is formed piezoresistive, in particular through a power line 26. The power line 26 is formed by an ion implantation process in the support layer 25 of the piezoelectric actuator 7. The power line 26 extends from a first electrical contact 27 to a second electrical contact 28. The two electrical contacts 27, 28 are preferably arranged in the area of the securely clamped end 29 of the actuator 7. The power line 26 is formed in a U-shape and features a first longitudinal part 30 and a second longitudinal part 31. The first longitudinal part 30 extends from the first electrical contact 27 into the cantilever 13, starting in the longitudinal direction of the cantilever. From a transverse part 32, the second longitudinal part 31 extends, starting in the longitudinal direction of the cantilever, from the cantilever 13 out to the second electrical contact 28, whereas the transverse part 32 extends in the transverse direction of the cantilever. In the manner just described, four such electrical resistors 33 are formed in the present case. The resistors 33 are different from each other and connected to the control unit 11 in such a manner that a Wheatstone measuring bridge is formed.

At this, the power lines 26, in particular the resistors 33, react to deformations that arise as a consequence of the pressure change that results from the membrane deflection. The resistors 33 react thereto with a change in resistance, which is detected and evaluated by the control unit 11.

Figure 6:
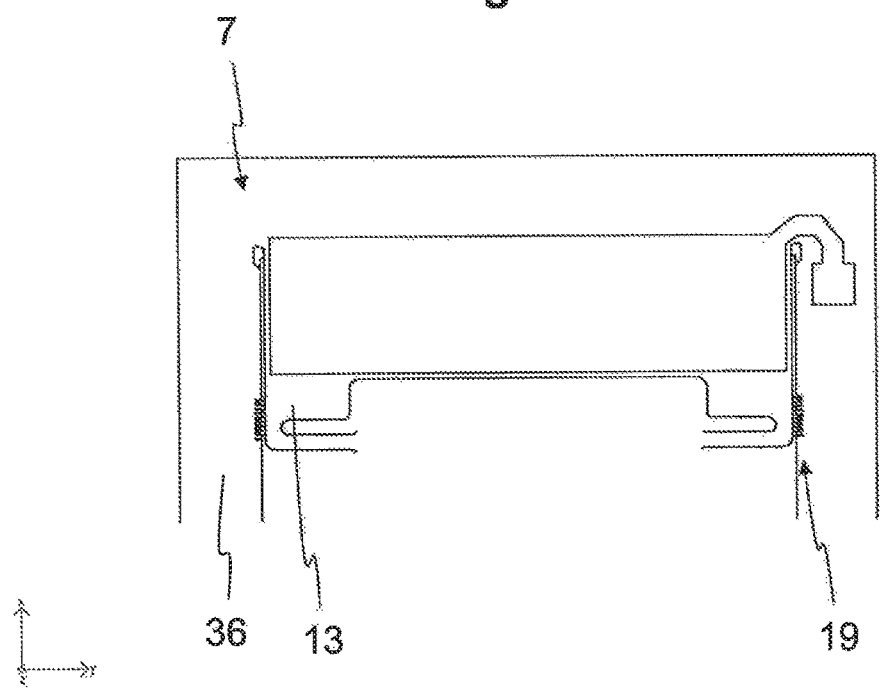

FIG. 6 shows a schematic top view of a fourth embodiment of the piezoelectric actuator 7 with an integrated capacitive position sensor 19. The capacitive position sensor 19 features recesses (not shown in further detail), in each of which an extension is arranged. Each extension is movable in the z-direction. In the illustrated embodiment, the recesses are arranged on a frame 36 and the extensions are arranged on the cantilever 13. The cantilever 13 is also deflectable in the z-direction. By contrast, the frame 36 is stationary and is preferably formed by the carrier substrate 9. However, it is also conceivable that the recesses are formed in the cantilever 13 and the extensions are formed on the frame 36. The recess features two inner surfaces, whereas at least one of the inner surfaces is designed as a first measuring electrode. The extension is designed either as a second measuring electrode or as a dielectric. In this manner, an electrical capacitor is formed.

As a consequence of the excitation of the membrane 2 by the actuator 7, the extensions on the cantilever 13 are also deflected. Thereupon, the distance between the individual extensions to the respective corresponding recess increases. Consequently, the distance of the two measuring electrodes or the distance between the first measuring electrode and the dielectric, as the case may be, also increases. Since the capacity is determined by just this distance, the control unit 11 detects a change in capacity due to the deflection. As a function of this capacitive sensor signal, the actuator 7 can be driven in a controlled manner in order to drive the membrane 2 in a controlled manner (see also FIG. 1).

Figure 7:
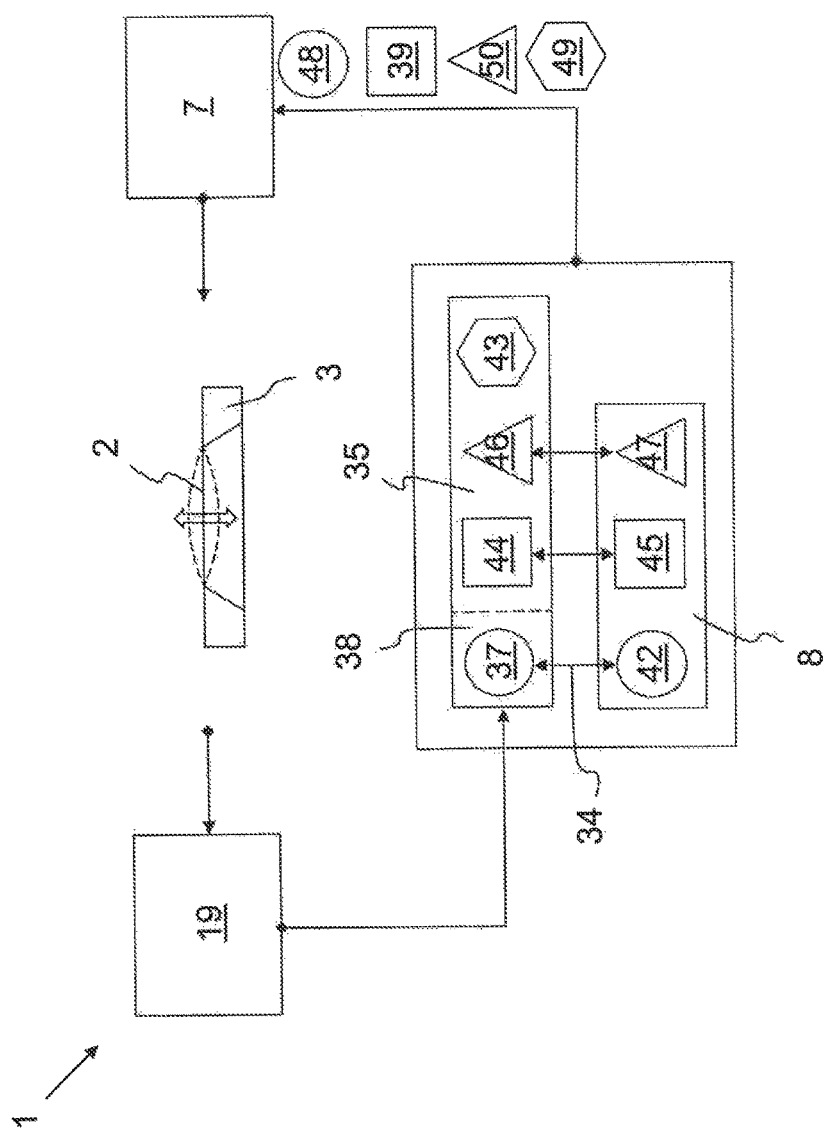

FIG. 7 schematically shows the mode of operation of the MEMS sound transducer that, in particular according to the preceding description, is designed as a MEMS loudspeaker 1 and/or a MEMS microphone. At this, the MEMS sound transducer comprises the membrane 2, which is mounted in a deflectable manner in the support element or membrane support 3, as the case may be, in the z-direction. Furthermore, the MEMS sound transducer comprises the piezoelectric actuator 7 and the position sensor 19. In turn, these are electrically connected to the control unit 11.

The control unit 11 is designed to perform a functional test, in order to reduce distortions, in order to avoid damages to the MEMS sound transducer and/or to recognize and compensate for behavioral changes of the MEMS sound transducer. For this purpose, the control unit 11 is designed such that it is capable of analyzing the actual sensor signal 37 and/or is capable of reconciling it with a reference signal 8 stored in the control unit 11. Furthermore, the control unit 11 is designed such that the actuator 7 can be driven in a controlled manner under consideration of an analysis result 35, which can be determined through the analysis of the actual sensor signal 37, and/or the comparison result.

For the functional self-test or for performing a functional self-test process (compare circular elements 37, 42, 48), the MEMS sound transducer can accordingly drive the actuator 7 with a reference actuator signal 48. In the memory unit of the control unit 11, a target sensor signal 42 is stored as a reference signal 8, which represents a target deflection of the membrane 2 that is dependent on the reference actuator signal 48. Through the drive of the membrane 2 by means of the actuator 7 with the reference actuator signal 48, this is deflected. The deflection is detected by the position sensor 19, which transmits an actual sensor signal 37 to the control unit 11. The actual sensor signal represents the actual standard behavior 38 and/or serves to determine the actual standard behavior 38 of the MEMS sound transducer. Within the framework of an actual/target reconciliation, the control unit 11 compares the actual sensor signal 37 with the stored target sensor signal 42. If the comparison result 34 does not produce a difference between the two signals, the MEMS sound transducer is operating properly. Otherwise, the control unit 11 recognizes a faulty mode of operation. A functional unit self-test described above or such a functional self-test process can be performed automatically by the control unit 11, in particular during system start or after external interference.

Furthermore, the control unit 11 is designed such that it is capable of analyzing the incoming actual sensor signal 37. As analysis results 35, the control unit 11 can determine, in particular, a maximum deflection 44, an actual natural frequency 46 and/or a non-linear oscillation 43 of the MEMS sound transducer. Furthermore, the control unit 11, in particular in a memory, stores a threshold value 45 and/or a reference natural frequency 47.

Within the framework of a distortion reduction or a distortion reduction process (see hexagon elements 43, 49), the control unit 11 can accordingly detect a non-linear oscillation 43 of the membrane 2 through an analysis of the actual sensor signal 37. Such non-linear oscillations are an indication of a distortion of the sound that is emitted. In the analysis and/or reconciliation of the actual sensor signal 37, the control unit 11 in particular uses at least one individual signal value and/or the chronological signal progression, in particular within one frequency range, of the sensor signal.

In order to be able to compensate for this identified distortion, the control unit 11 is further designed such that it is able to drive the actuator 7 with a compensation actuator signal 49, which at least partially reduces the non-linear oscillation 43 that is detected. As a result, the membrane 2 can once again be led back to a non-distorting deflection area.

For performing a damage protection process in order to prevent damage to the membrane 2, the actuator 7 and/or the position sensor 19 due to overload, the control unit 11 is further designed such that, initially through an analysis of the actual sensor signal 37 and through a reconciliation with a threshold 45, it can identify a corresponding overload (see square elements 39, 44, 45). Accordingly, the threshold value 45 defines a maximum permissible threshold value level, up to which the MEMS transducer can be operated at least without damage.

Through the reconciliation of the maximum deflection 44 and the threshold value 45, the control unit 11 can determine whether an overload is imminent or has already occurred. Shortly before the maximum deflection 44 exceeds the threshold value 45 or immediately after it has exceeded it, the control unit 11 drives the actuator 7 with a reduced actuator signal 39. Accordingly, such actuator signal 39, reduced when compared to the previous actuator signal, causes a second deflection reduced to a first deflection of the membrane 2. As a result, an overloading of the MEMS components that have been moved can advantageously be avoided.

Furthermore, knowledge of the actual natural frequency 46 of the MEMS sound transducer is advantageous for damage protection or for performing the damage protection process. The same applies to the compensation of behavioral changes of the MEMS sound transducer or to the performance of a compensation process, as the case may be (see triangular elements 46, 47, 49).

In order to be able to analytically determine the actual natural frequency 46, an analysis actuator signal 50 is stored in the memory unit of the control unit 11. This preferably consists of a noise signal that extends in one frequency range below the resonance frequency of the MEMS sound transducer. The actuator 7 is driven with this analysis actuator signal 50. The actual sensor signal 37 fed back by the position sensor 19 is analyzed by the control unit 11 in order to be able to determine a maximum within the frequency range. This maximum then identifies the actual natural frequency 46 of the MEMS sound transducer. The control unit 11 is then designed such that, through a reconciliation of the analytically determined actual natural frequency 46 with the stored reference natural frequency 47, it is able to determine a change to the natural frequency.

In the event that a deviation is detected, it is advantageous for damage protection if the new natural frequency (i.e., the actual natural frequency 46) is stored in the memory of the control unit 11 as a new reference natural frequency 47. In order to prevent damage to the MEMS sound transducer, this may specifically only be excited for a limited period of time in the range of the natural frequency. Upon the further drive of the membrane 2, the control unit 11 then takes into account the new reference natural frequency 47 and accordingly drives the membrane 2 in such frequency range in a time-controlled manner.

Furthermore, however, such a change to the natural frequency of the MEMS sound transducer may also be a consequence of external influences, in particular pressure or temperature changes, or of aging effects. To compensate for such behavioral changes of the MEMS sound transducer, it is accordingly also advantageous if, upon an analytically determined change to the natural frequency, the actual natural frequency 46 is stored as a new reference natural frequency 47 and is henceforth taken into account in the drive of the actuator 7. For this purpose, the control unit 11 drives the actuator 7 with a corresponding compensation actuator signal 49.

This invention is not limited to the illustrated and described embodiments. Variations within the scope of the claims, just as the combination of characteristics, are possible, even if they are illustrated and described in different embodiments.

LIST OF REFERENCE SIGNS

1 MEMS loudspeaker
2 Membrane
3 Membrane carrier
4 Edge area
5 Reinforcing element
6 Lifting structure
7 Actuator
8 Stored reference signals
9 Carrier substrate
10 Circuit board
11 Control unit
12 Additional passive components
13 Cantilever
14 Housing
15 Upper housing part
16 Lower housing part
17 Sound-conducting channel
18 Acoustic inlet/outlet opening
19 Position sensor
20 Sensor area
21 Actuator area
22 Connecting element
23 First piezoelectric layer
24 Second piezoelectric layer
25 Support layer
26 Power line
27 First electrical contact
28 Second electrical contact
29 Securely clamped end
30 First longitudinal part
31 Second longitudinal part
32 Transverse part
33 Resistors
34 Comparison result
35 Analysis result
36 Frame
37 Actual sensor signal
38 Actual standard behavior
39 Reduced actuator signal
40 ASIC
41 Common piezoelectric layer
42 Target sensor signal
43 Non-linear oscillation
44 Maximum deflection
45 Threshold value
46 Actual natural frequency
47 Reference natural frequency
48 Reference actuator signal
49 Compensation actuator signal
50 Analysis actuator signal

The invention claimed is:

1. MEMS sound transducer for generating sound waves in the audible wavelength spectrum, comprising:
a support element;
a membrane deflectable with respect to the support element along a z-axis;
a piezoelectric actuator supported on the support element and disposed for deflecting the membrane when the piezoelectric actuator becomes driven;
an electronic control unit connected to the piezoelectric actuator and configured for driving the piezoelectric actuator; and
a position sensor connected to the control unit and configured and disposed to provide to the electronic control unit an actual sensor signal that is dependent on the membrane deflection;
wherein the control unit is configured for performing a functional self-test process that examines whether the position sensor is functioning properly; and
wherein the control unit is configured to analyze the actual sensor signal to obtain an analysis result and drive the actuator in a controlled manner in accordance with the analysis result;
wherein the control unit is configured so that during the functional self-test process, through the analysis of the actual sensor signal, the control unit determines an actual standard behavior of the MEMS sound transducer;
wherein the control unit is configured to store therein for performing the functional self-test process, a reference actuator signal, which reflects the target standard behavior of the MEMS sound transducer, and wherein the control unit is configured to store therein for performing the functional self-test process, a target sensor signal that is dependent on the reference actuator signal; and
wherein the control unit is configured so that during performance of the functional self-test process, the control unit drives the actuator with the reference actuator signal generating a target deflection, reconciles the actual sensor signal with the target sensor signal, and detects whether there exists a deviation of the actual sensor signal from the target sensor signal.

2. MEMS sound transducer according to claim 1, wherein the position sensor is configured to generate a continuous sensor signal having a plurality of signal values that chronologically form a chronological signal progression of the plurality of signal values, and wherein the control unit is configured to analyze in one frequency range, one of the plurality of signal values of the continuous sensor signal or a chronological signal progression of the continuous sensor signal.

3. MEMS sound transducer according to claim 1, wherein the control unit is configured to issue an error message upon detection of a deviation of the actual sensor signal from the target sensor signal by a predetermined threshold magnitude.

4. MEMS sound transducer for generating sound waves in the audible wavelength spectrum, comprising:
a support element;
a membrane deflectable with respect to the support element along a z-axis;
a piezoelectric actuator supported on the support element and disposed for deflecting the membrane when the piezoelectric actuator becomes driven;
an electronic control unit connected to the piezoelectric actuator and configured for driving the piezoelectric actuator; and
a position sensor connected to the control unit and configured and disposed to provide to the electronic control unit an actual sensor signal that is dependent on the membrane deflection;
wherein the control unit is configured for performing a distortion reduction process, which detects distortion in the sound output from the MEMS sound transducer and reduces the detected distortion;
wherein the control unit is configured to analyze the actual sensor signal to obtain an analysis result and drive the actuator in a controlled manner in accordance with the analysis result;
wherein the control unit is configured so that during the distortion reduction process, the control unit conducts an analysis of the actual sensor signal and accordingly determines whether the analysis reveals the presence of a nonlinear oscillation of the MEMS sound transducer; and
wherein the control unit is configured so that when the control unit determines the presence of a nonlinear oscillation of the MEMS sound transducer during the distortion reduction process, the control unit then drives the actuator with a compensation actuator signal that at least partially reduces the non-linear oscillation of the MEMS sound transducer.

5. MEMS sound transducer for generating sound waves in the audible wavelength spectrum, comprising:
a support element;
a membrane deflectable with respect to the support element along a z-axis;
a piezoelectric actuator supported on the support element and disposed for deflecting the membrane when the piezoelectric actuator becomes driven;
an electronic control unit connected to the piezoelectric actuator and configured for driving the piezoelectric actuator; and
a position sensor connected to the control unit and configured and disposed to provide to the electronic control unit an actual sensor signal that is dependent on the membrane deflection;
wherein the control unit is configured for performing a damage protection process for protecting the actuator, the position sensor or the membrane against damage;
wherein the control unit is configured to analyze the actual sensor signal to obtain an analysis result and drive the actuator in a controlled manner in accordance with the analysis result;
wherein the control unit is configured so that during the damage protection process, the control unit analyzes the actual sensor signal and accordingly determines a maximum deflection of the membrane;
wherein the control unit is configured so that when detecting an overload during the damage protection process, the control unit reconciles the actual sensor signal with a maximum permissible threshold value up to which the MEMS transducer can be operated without damage; and
wherein the control unit is configured so that during the damage protection process, when the actual sensor signal indicates that the first deflection exceeds the threshold value, then the control unit drives the actuator with a reduced actuator signal, which reduces the magnitude of the deflection of the membrane.

6. MEMS sound transducer for generating sound waves in the audible wavelength spectrum, comprising:
   a support element;
   a membrane deflectable with respect to the support element along a z-axis;
   a piezoelectric actuator supported on the support element and disposed for deflecting the membrane when the piezoelectric actuator becomes driven;
   an electronic control unit connected to the piezoelectric actuator and configured for driving the piezoelectric actuator; and
   a position sensor connected to the control unit and configured and disposed to provide to the electronic control unit an actual sensor signal that is dependent on the membrane deflection;
   wherein the control unit is configured for performing a compensation process for the compensation of behavioral changes in the actuator, the position sensor or the membrane;
   wherein the control unit is configured to analyze the sensor signal to obtain an analysis result and drive the actuator in a controlled manner in accordance with the analysis result;
   wherein the control unit is configured so that during the compensation process, the control unit analyzes the actual sensor signal and accordingly determines an actual natural frequency of the MEMS sound transducer;
   wherein the control unit is configured so that during the compensation process, the control unit determines the actual natural frequency of the MEMS sound transducer by driving the actuator with an analysis actuator signal; and
   wherein the control unit is configured to drive the actuator while taking into account the actual natural frequency of the MEMS sound transducer, whereas, for the compensation of the behavioral change that is detected, this compensation process takes place with a compensation actuator signal.

7. MEMS sound transducer for generating sound waves in the audible wavelength spectrum, comprising:
   a support element,
   a membrane deflectable with respect to the support element along a z-axis,
   at least one piezoelectric actuator supported on the support element and disposed for deflecting the membrane when the one piezoelectric actuator becomes driven,
   an electronic control unit connected to the actuator for driving the actuator, and
   a position sensor connected to the electronic control unit and configured to provide to the electronic control unit an actual sensor signal that is dependent on the membrane deflection,
   wherein the electronic control unit is configured for performing a damage protection process,
   wherein the control unit is configured to reconcile the actual sensor signal with a reference signal stored in the control unit to obtain a comparison result and drive the actuator in a controlled manner in accordance with the comparison result;
   wherein the control unit is configured so that during the damage protection process, the control unit analyzes the actual sensor signal and accordingly determines a maximum deflection of the membrane;
   wherein the control unit is configured so that when detecting an overload during the damage protection process, the control unit reconciles the actual sensor signal with a maximum permissible threshold value up to which the MEMS transducer can be operated without damage;
   wherein the control unit is configured so that during the damage protection process, when the actual sensor signal indicates that the first deflection exceeds the threshold value, then the control unit drives the actuator with a reduced actuator signal, which reduces the magnitude of the deflection of the membrane;
   wherein the control unit is further configured for performing a compensation process for the compensation of behavioral changes in the actuator, the position sensor or the membrane; and wherein the control unit is configured so that during the compensation process, the control unit reconciles the actual natural frequency of the MEMS sound transducer with a stored reference natural frequency of the MEMS sound transducer.

8. MEMS sound transducer for generating sound waves in the audible wavelength spectrum, comprising:
   a support element,
   a membrane deflectable with respect to the support element along a z-axis,
   at least one piezoelectric actuator supported on the support element and disposed for deflecting the membrane when the one piezoelectric actuator becomes driven,
   an electronic control unit connected to the actuator for driving the actuator, and
   a position sensor connected to the electronic control unit and configured to provide to the electronic control unit an actual sensor signal that is dependent on the membrane deflection,
   wherein the electronic control unit is configured for performing a damage protection process,
   wherein the control unit is configured to reconcile the actual sensor signal with a reference signal stored in the control unit to obtain a comparison result and drive the actuator in a controlled manner in accordance with the comparison result;
   wherein the control unit is configured so that during the damage protection process, the control unit analyzes the actual sensor signal and accordingly determines a maximum deflection of the membrane;
   wherein the control unit is configured so that when detecting an overload during the damage protection process, the control unit reconciles the actual sensor signal with a maximum permissible threshold value up to which the MEMS transducer can be operated without damage;
   wherein the control unit is configured so that during the damage protection process, when the actual sensor signal indicates that the first deflection exceeds the threshold value, then the control unit drives the actuator with a reduced actuator signal, which reduces the magnitude of the deflection of the membrane; and
   wherein the position sensor is configured to generate a continuous sensor signal having a plurality of signal values that chronologically form a chronological signal progression of the plurality of signal values, and wherein the control unit is configured to reconcile in one frequency range, one of the plurality of signal values of the continuous sensor signal or a chronological signal progression of the continuous sensor signal.

9. MEMS sound transducer according to claim 7, wherein the control unit is configured so that when detecting an overload during the damage protection process, the control unit reconciles the actual sensor signal with a maximum permissible threshold value up to which the MEMS transducer can be operated without damage.

10. MEMS sound transducer according to claim 7, wherein the control unit is configured so that during the damage protection process, when the actual sensor signal indicates that the deflection of the membrane exceeds a threshold value, then the control unit drives the actuator with a reduced actuator signal, which generates a deflection of the membrane that is reduced in magnitude from the threshold value.

11. MEMS sound transducer according to claim 7, wherein the control unit is configured so that during the compensation process, when the control unit reconciles the actual natural frequency of the MEMS sound transducer with the stored reference natural frequency of the MEMS sound transducer and determines a deviation between the actual natural frequency of the MEMS sound transducer and the stored reference natural frequency of the MEMS sound transducer, then the control unit replaces the stored reference natural frequency of the MEMS sound transducer with the actual natural frequency of the MEMS sound transducer as a new stored reference natural frequency of the MEMS sound transducer.

* * * * *